(12) United States Patent
Siarkowski et al.

(10) Patent No.: US 7,587,690 B1
(45) Date of Patent: Sep. 8, 2009

(54) METHOD AND SYSTEM FOR GLOBAL COVERAGE ANALYSIS

(75) Inventors: Bret Siarkowski, Marlborough, MA (US); Manish Pandey, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 326 days.

(21) Appl. No.: 11/454,075

(22) Filed: Jun. 14, 2006

Related U.S. Application Data

(63) Continuation-in-part of application No. 10/836,700, filed on Apr. 29, 2004, now Pat. No. 7,216,318.

(60) Provisional application No. 60/466,698, filed on Apr. 29, 2003.

(51) Int. Cl.
*G06F 17/50* (2006.01)
(52) U.S. Cl. .................... 716/4; 716/5; 716/6
(58) Field of Classification Search ............... 716/1–6; 714/724–726, 733
See application file for complete search history.

(56) References Cited

U.S. PATENT DOCUMENTS

| | | | |
|---|---|---|---|
| 5,754,454 A | 5/1998 | Pixley et al. | |
| 6,408,121 B1 | 6/2002 | Goto | |
| 6,408,424 B1 | 6/2002 | Mukherjee et al. | |
| 6,457,162 B1 * | 9/2002 | Stanion | 716/7 |
| 6,463,560 B1 * | 10/2002 | Bhawmik et al. | 714/733 |
| 6,473,884 B1 | 10/2002 | Ganai et al. | |
| 6,611,947 B1 * | 8/2003 | Higgins et al. | 716/5 |
| 6,678,645 B1 | 1/2004 | Rajsuman et al. | |
| 6,934,921 B1 | 8/2005 | Gu et al. | |
| 6,996,515 B1 * | 2/2006 | Foltin et al. | 703/19 |
| 2002/0016952 A1 * | 2/2002 | Chang et al. | 716/18 |
| 2002/0174407 A1 | 11/2002 | Furusawa | |
| 2003/0101399 A1 * | 5/2003 | Yoshikawa | 714/744 |
| 2003/0149945 A1 * | 8/2003 | Abadir et al. | 716/3 |
| 2004/0268279 A1 | 12/2004 | Oleksinski et al. | |
| 2007/0168903 A1 * | 7/2007 | Kahng et al. | 716/19 |

OTHER PUBLICATIONS

Ashar, P. et al. "Exploiting Multi-Cycle False Paths in the Performance Optimization of Sequential Circuits", Proceedings of the 1992 IEEE/ACM International Conference on Computer Aided Design, 1992, pp. 510-517.

Beatty, D. et al. "Fast Incremental Circuit Analysis Using Extracted Hierarchy", Proceedings of the 25th ACM/IEEE Design Automation Conference, 1988, pp. 495-500.

Bergamaschi, R. "The Effects Of False Paths In High-Level Synthesis", Proceedings of the 1991 IEEE International Conference on Computer-Aided Design (ICCAD '91), Nov. 1991, vol. 11, Issue 14, pp. 80-83.

(Continued)

*Primary Examiner*—Paul Dinh
(74) *Attorney, Agent, or Firm*—Vista IP Law Group, LLP.

(57) ABSTRACT

Disclosed are methods and systems for performing coverage analysis. In one approach, the methods and systems perform coverage analysis based upon both implementation-specific design data and non-implementation-specific design data. In an approach, both gate level and RTL level information are considered to perform coverage analysis.

38 Claims, 6 Drawing Sheets

OTHER PUBLICATIONS

Burch, J. et al. "Tight Integration Of Combinational Verification Methods", Proceedings of the 1998 IEEE/ACM International Conference on Computer Aided Design (ICCAD '98), 1998, pp. 570-576.

Moskewicz, M. et al, "CHAFF: Engineering an Efficient SAT Solver", Proceedings of the 38th ACM/IEEE Conference on Design Automation, 2001, pp. 530-535.

Nekoogar, F., "Timing Verification of Application-Specific Integrated Circuits (ASICs)", Prentice Hall PTR, Upper Saddle River, NJ, USA, 1999, pp. 17-97.

Nourani, M. et al. "False Path Exclusion in Delay Analysis of RTL Structures", IEEE Transactions on Very Large Scale Integration (VLSI) Systems, Feb. 2002, vol. 10, Issue 1, pp. 30-43.

* cited by examiner

Equivalence checking of two designs with identical state encoding

METHOD AND SYSTEM FOR GLOBAL COVERAGE ANALYSIS

CROSS-REFERENCE TO RELATED APPLICATIONS

The present application is a continuation in part of U.S. Ser. No. 10/836,700, filed on Apr. 29, 2004, now U.S. Pat. No. 7,216,318 entitled "A METHOD AND SYSTEM FOR FALSE PATH ANALYSIS" which claims priority to U.S. Provisional Application Ser. No. 60/466,698, filed on Apr. 29, 2003, both of which are hereby incorporated by reference in their entirety.

BACKGROUND AND SUMMARY

Static timing analysis (STA) can determine if there exist paths in an electrical circuit design with delays that exceed a given timing threshold. Such paths are commonly known as critical paths (CPs). When such a critical path is identified, the portion of the design associated with the critical path may need to be modified to satisfy the required timing thresholds. It is generally not preferred to make such design modifications if they can be avoided, since each such modification consumes time and system resources, as well as possibly introducing less optimal component configurations and sizes.

Modern designs generally consist of multiple sub-designs with varying functionality and may operate at different clock frequencies. The timing threshold for critical paths varies according to the clock frequency of the sub-design under consideration. Since STA generally considers all paths in an electrical circuit, a set of constraints (also called a mode or a design mode) may be applied to a design such that only sub-designs with a desired timing threshold or functionality are considered for analysis while other sub-designs are not considered or hidden from analysis. The set of constraints for each sub-design are typically created manually and require an independent STA run for each mode or set of constraints to ensure that the entire design is "covered" by STA and all critical paths have been identified.

However, mismanagement of the sets of constraints and corresponding STA runs could cause less than 100% STA coverage resulting in undetected critical paths. Since the number design modes or sets of constraints can exceed, for example, 32 in a modern design, a significant amount of time and system resources may need to be expended to ensure 100% STA coverage such that all critical paths have been identified.

Therefore, it is important to verify complete STA coverage by accurately identifying that all sub-designs have been considered by STA such that all critical paths have been considered.

Most approaches have focused on manual STA coverage analysis of the sets of constraints and corresponding STA runs to ensure that no critical paths have been missed. The typical design flow can involve a large number of static timing analysis (STA) runs in an iterative process. Each time the design is optimized via synthesis, floor planning, place and route, in-place optimization, and/or back annotated post layout, static timing analysis can be performed. The number of STA runs increase for each mode that is considered and increases the effort to verify complete STA coverage.

In a modern design there may be several modes, for example, one or more test modes and multiple functional modes. Typically, the constraints for each mode are created and analyzed manually Generation of constraints for each mode and subsequent STA analysis for a typical design can take several weeks to several months and is very error prone and complete coverage is not easy to determine.

For example, very often, incremental changes can be made to a design. Incremental design changes can imply that from one static timing run to the next, many of the same constraints still apply. However, design changes may cause some of the constraints to become invalid. The constraints that are manually generated initially might not be re-verified when incremental changes are made to the design. The constraints that are no longer valid (invalid constraints) can cause incomplete STA coverage and a bad design to be implemented.

Coverage analysis has been investigated within the context of individual STA runs or for localized design regions. For example, some static timing tools detect paths that are logically never used with Automated test Pattern Generation (ATPG) techniques; however, these techniques have been limited to a single set of constraints or single mode of operation without consideration of additional constraints or modes that can be imposed by independent STA runs. Moreover, current tools do not provide an automated mechanism to analyze global coverage across several independent STA runs. The problems of identifying global coverage can often involve human intervention. This human intervention can be required because the coverage reported for each STA run can be reported without consideration of multiple STA runs that are required to implement a modern design. Identification of global coverage is often managed manually and can require extensive communication between the engineer that performs the static timing analysis and designers that understand the architecture of the design. The manual analysis of the global coverage analysis can be quite time consuming and error prone, adding weeks to months in the design process. Errors in the static timing analysis could lead to the manufacture of a bad design.

To illustrate this, consider an example coverage analysis problem when static timing is used to analyze a circuit and when it is desired to determine if the analysis has actually covered the whole design. In this example, assume that a design is considered which operates in two modes, test mode and functional mode. When analyzing the timing for the functional mode, the test logic will be turned off so that the test enable will be "off" or "disabled" and the static timing tool will only see the logic or the path in which the circuit path corresponds to the functional mode. When a designer finishes performing a set of timing, the designer is satisfied that he has performed functional mode coverage. Next, the designer will run another static timing run and will turn on the test mode and disable the functional mode to look at all the path and circuit connections in test mode. Now, if this is the only constraint that has changed, then the designer has performed two completely separate static timing analysis runs and if the designer has in fact switched the "test bit" from a zero to a one, then it can be assumed that the whole design has been covered.

However, in practice, designers today are running a large number of different modes. After running many different static timing runs, a designer could have made a mistake in determining whether any portion of the design has or has not been covered, e.g., that when the designer copied and modified files for the timing analysis runs, designers could have mistakenly cut and pasted exactly the same thing and run two static timing run on exactly the same circuit and missed the timing of another part of the circuit.

Today, there are no known approaches for addressing this problem, which can for example, go through and consider all the independent static timing analysis runs, grab all the setup files and then perform analysis to make sure that the entire chip properly undergoes timing analysis. If it cannot be ensured that entire chip design has undergone timing analysis, then there might exist a slow path that was not discovered, which could result in an IC chip that is not functional.

Embodiments of the present invention provide a method and system for performing automatic STA coverage analysis while existing constraints can be automatically verified and/or automatically regenerated to ensure complete STA coverage. Using some embodiments of the present invention, STA coverage can be automatically verified while existing constraints can be automatically verified and/or automatically regenerated, ensuring complete STA coverage as well as accurate and efficient design implementation.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE FIGURES

The accompanying drawings are included to provide a further understanding of the invention and, together with the Detailed Description, serve to explain the principles of the invention.

DETAILED DESCRIPTION

Embodiments of the present invention provide a method and system for performing automatic STA coverage analysis while existing constraints can be automatically verified and/or automatically regenerated to ensure complete STA coverage.

In one embodiment, several sets of constraints for independent STA runs are analyzed. Embodiments of the invention provide automatic methods and systems for coverage analysis of RTL or gate-level static timing analysis runs, identification of hidden logic, and constraint generation using architectural information. Accurate gate level timing data in conjunction with the architectural design data and formal methods can be used to identify false paths. The combination of formal techniques with static timing analysis to identify coverage using information from multiple STA runs as well as architectural information yields improved results in identifying global coverage. Some embodiments can use non-formal techniques such as simulation.

In some present embodiments, by combining static timing analysis with formal techniques such as equivalence checking (EC) for mapping gate level information to architectural information, model checking to identify unreachable states, and/or automated false path analysis for use in identifying global coverage analysis, the amount of manual effort can be minimized. Some embodiments can use non-formal techniques such as simulation.

In one or more embodiments of the invention, static timing paths at the gate-level can be linked to the architectural information via techniques such as logic cone and/or state point correspondence, such as commonly used in equivalence checking (EC). The gate-level static timing paths can be analyzed in the context of the architectural information to identify false paths. The analysis of gate-level paths in the context of the architectural information can enable identification of global coverage that cannot be identified in the context of gate-level information alone. Furthermore this automated approach can be less error prone and/or much more efficient than existing techniques which are commonly manual techniques.

Various embodiments include methods performing the technology described herein, code (at least partly hardware and/or at least partly software) performing the technology described herein, and one or more computers performing the technology described herein.

Figure 1A:
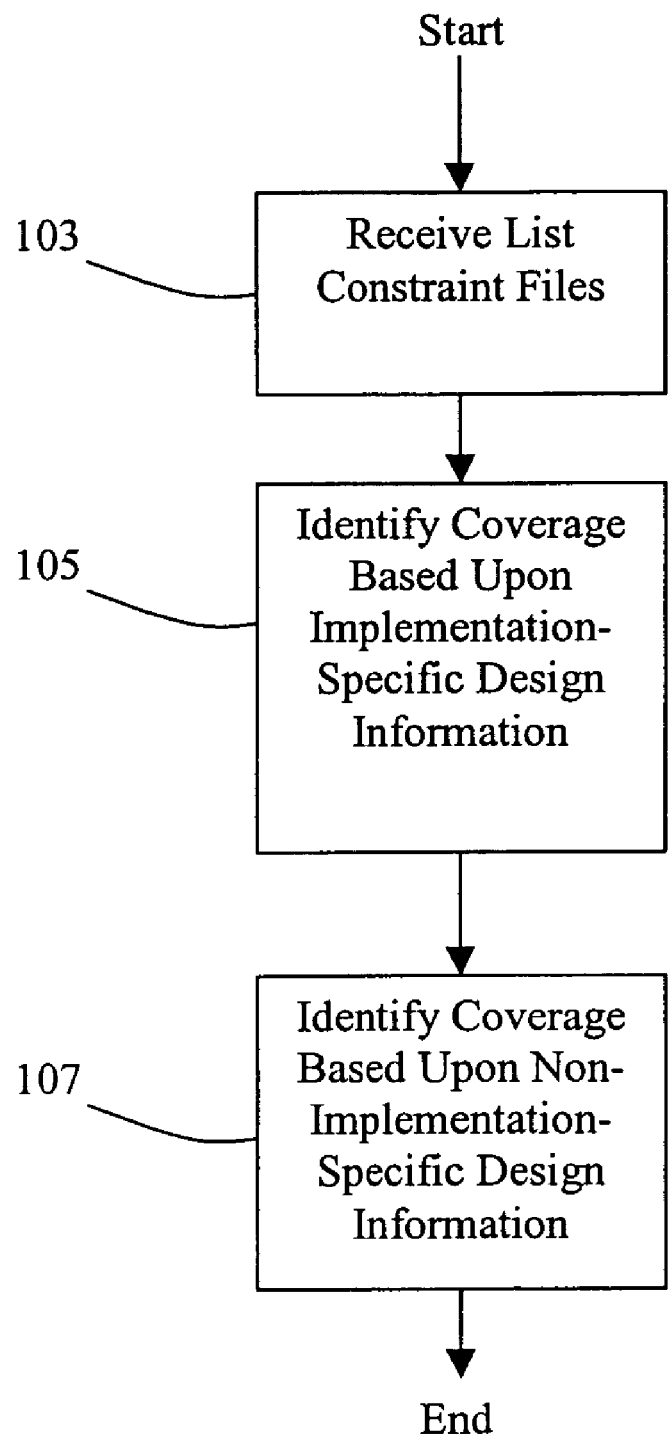
FIGS. 1A and 1B illustrate flow diagrams of processes for performing coverage analysis, according to embodiments of the invention.

FIG. 1A shows a high-level flowchart of a process for performing coverage analysis according to an embodiment of the invention. At 103, the process receives a list of constraint files for the circuit design. The constraint files are the files that guide the static timing run. In the earlier described example in which the timing analysis made a distinction between test mode and functional mode, the constraint file would contain information regarding the one bit that is either zero or one to indicate whether either test mode or functional mode is being analyzed. The constraint files may be very complex, with many hundreds or thousands of lines of constraints.

At 105, the process identifies coverage based upon implementation-specific design information. Such implementation-specific design information includes, but is not limited to, gate level design data resulting from synthesizing the circuit design.

At 107, the process identifies coverage based upon non-implementation-specific design information about the circuit design. Such non-implementation-specific design information includes architectural design data, which includes but is not limited to RTL code (e.g., VHDL and Verilog), behavioral code, synthesis pragmas, embedded assertions or constraints, side file assertions or constraints, macro cell information, and library information. Architectural design data can also include gate level design data augmented with architectural information such as assertions, pragmas, side-files, constraints, macro cell information, and/or library information.

Architectural design data can also include any other source of data beyond bare netlists describing connections among library cells, that provides information which helps to identify false paths (e.g., helping to find: invalid constraints, inconsistent CPs, CPs that cannot be sensitized, assertion based FPs, don't care FPs, and architectural FPs). Such false paths commonly arise from, but are not limited to, synthesis don't care optimizations and/or architecturally unreachable conditions. These conditions may result in gate-level sensitizable paths, which are not sensitizable in the architectural design data or when sensitized in the context of the architectural design data, generate a don't care condition. False path information also known as constraints can be used in synthesis and place and route tools. These constraints can enable the tools to achieve desired design performance (e.g., power, area, and/or speed) and/or timing closure by focusing effort on real paths instead of false paths.

One advantage of this process is that, given the constraint information, it is able to look at the constraint files and analyze coverage in the context of both the high level and the low level abstractions of the design. An example of coverage that is addressed by this process includes logic gates in the design.

Therefore, coverage can be viewed by logic gates which are not addressed by the timing analysis. Another example of coverage includes "paths" or "timing paths" in the design. For instance, if the design includes a signal A that goes through a particular path to an output B, then the timing path from A to B could comprise start and end points as a way to look at coverage.

Figure 1B:
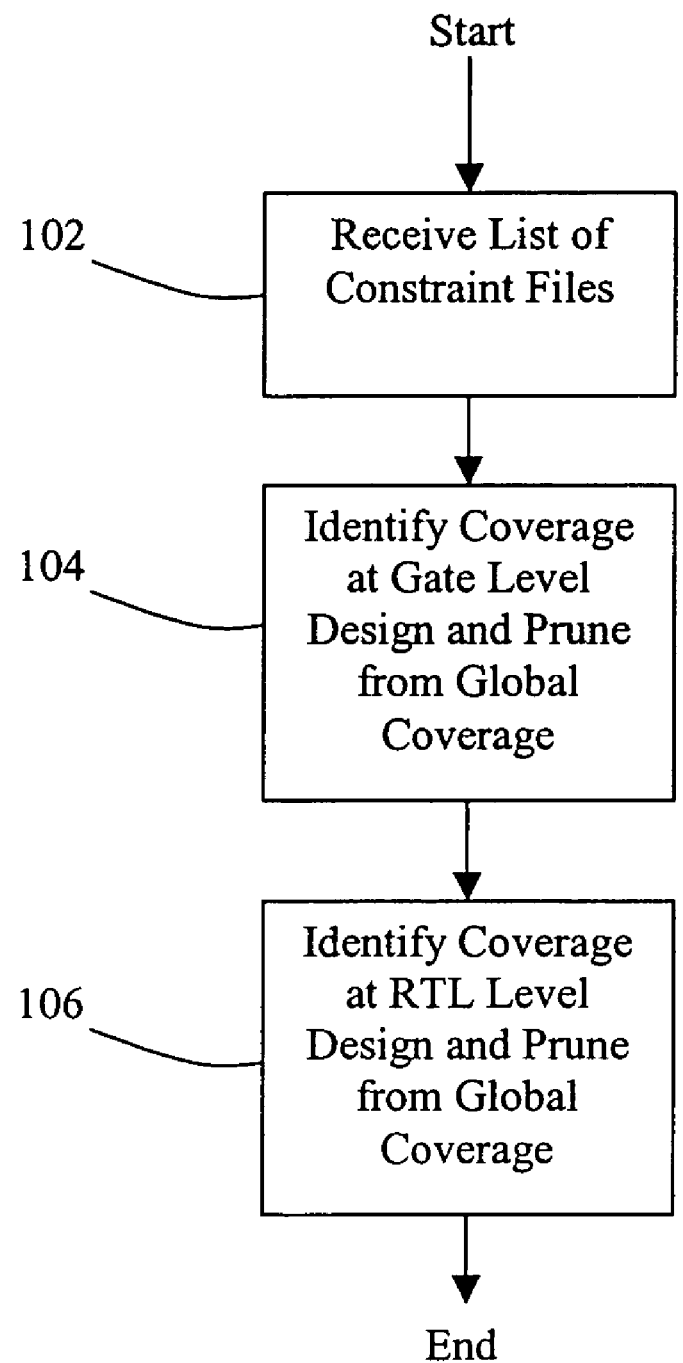

FIG. 1B shows a process for performing constraint analysis for specific types of implementation-specific and non-implementation-specific design information. As before, an initial list of one or more critical paths is received by the process (102). At 104, implementation-specific design information in the form of gate-level information is used to identify coverage, and then the identified set of paths are pruned from the list of critical paths that must be addressed.

In addition, non-implementation-specific design information in the form of RTL-level architectural information is used to identify coverage, with these RTL-derived paths also pruned from the list of critical paths to must be addressed (106). Various embodiments of the invention make use of equivalence checking, model checking, Binary Decision Diagrams (BDDs), Satisfiability Solvers (SAT), and/or Automatic Test Pattern Generators (ATPG) to automatically identify and analyze gate level static timing results using architectural information. Various embodiments can add, delete, combine, rearrange, and/or modify parts of this framework.

In an example implementation, this process works by reading in the raw design. Assume that the design has one million gates in it. Then, what occurs is that the process applies the first constraint file. If the constraint file is set test mode on, then only the test mode logic is visible, e.g., maybe a half million gates are visible and the other half are logically turned off so they are not visible. The process starts off with a set of information for the coverage that would be all of the paths or all of the logic elements without any constraints, to which the process would then apply the first file of constraints. If this makes only a certain number visible, then those would be pruned the list. Then the next constraint file is applied. However, the process does not have to do the work again on the group of data since they have already been covered. So we look at the next file and a certain number are also made visible which are also pruned from the list.

Figure 2:
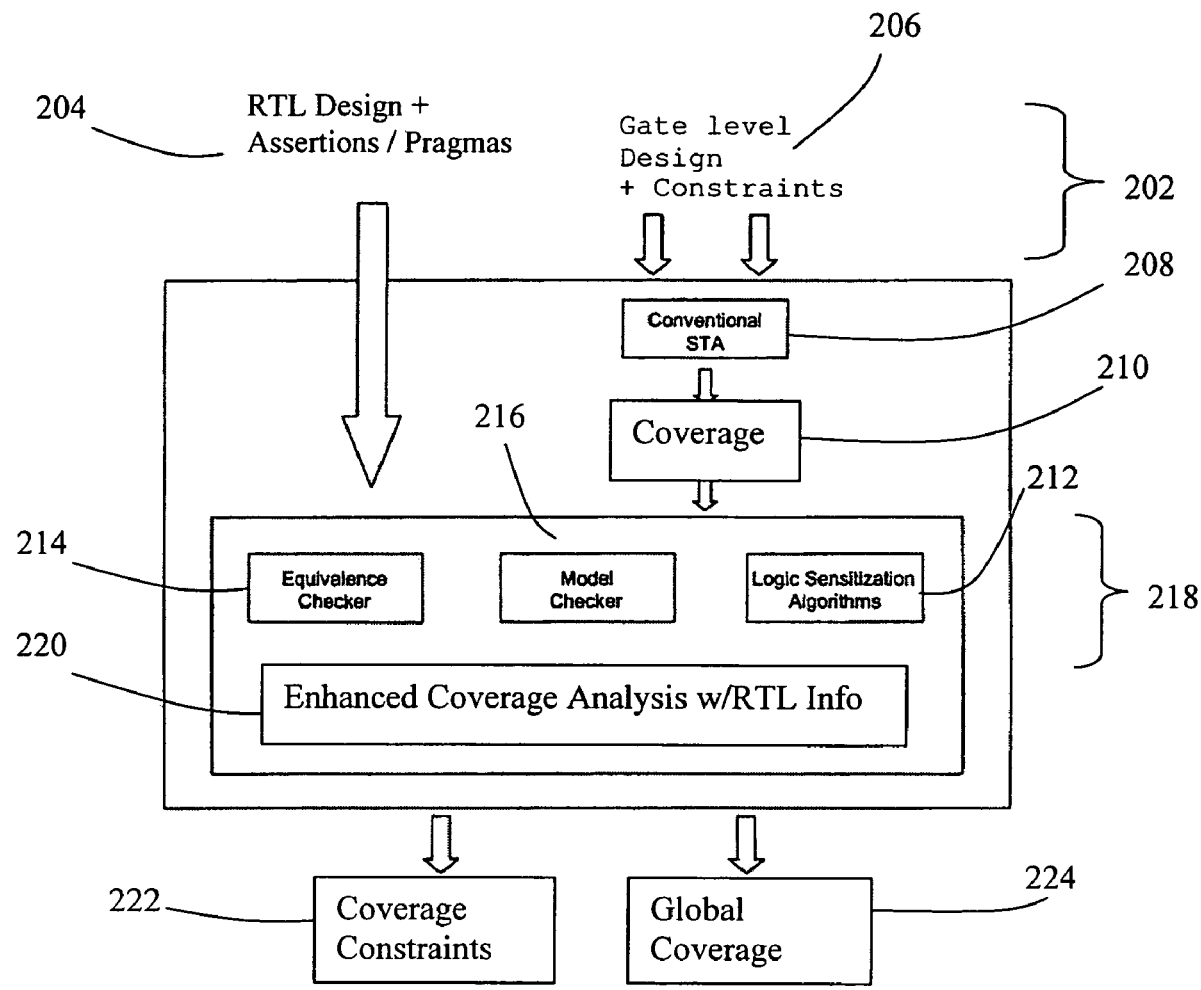
FIG. 2 illustrates a high-level framework of a formal static timing analysis coverage system.

FIG. 2 illustrates a high-level framework/architecture for implementing an embodiment of the invention. The following items are some example components of the framework shown in FIG. 2:

Design data
Gate level design including libraries
Architectural information e.g., RTL design, assertions and side files
Static timing analysis data
Initial static timing constraints
Critical paths
Formal engines
Equivalence checker
Model checker
Logic sensitization algorithms
Solvers
False path constraint identification and analysis manager (FP-CIA) which can accept design data and static timing analysis data and uses formal engines to analyze and identify false paths (i.e., architectural, logical, don't care, multi-cycle, clock-domain crossing, delay based, etc)

Design data 202 can include a gate level net-list and the function of the library cells that are instantiated in the gate level net-list. Architectural design data can include RTL design data 204, for example source code (e.g., Verilog or VHDL) that corresponds to the gate level design data, and/or gate level design data. This RTL design data 204 can be augmented with information that can include assertions, pragmas, side-files, constraints, macro cell information, and/or library information. Architectural design data can also include gate level design data 206 augmented with architectural information such as assertions, pragmas, side-files, constraints, macro cell information, and/or library information. Architectural design data can also include any other source of data beyond bare netlists describing connections among library cells, that provides information which helps to identify coverage. An example of an assertion is a constraint that "asserts" that two primary inputs are mutually exclusive. In some circumstances, such information cannot be derived independently from the gate level design data or the RTL design data.

Static timing analysis data 208 includes initial constraints as well as a coverage list 210. Formal engines 218 are used for solving the specific problem identified by the enhanced coverage analysis manager 220. For example conventional ATPG sensitization algorithms 212, equivalence checkers 214, and model checkers 216 may be employed in conjunction with the enhanced coverage analysis manager 220. Some embodiments can use nonformal techniques such as simulation.

Essentially, the system takes the gate level design and constraint information, and it performs conventional static timing analysis. In one embodiment, the coverage box 210 refers to the process action 104 of FIG. 1B. That information is passed into this middle section along with RTL design and any assertions, and the system then performs enhanced coverage analysis with RTL using the enhanced coverage analysis manager 220. In one embodiment, the enhanced coverage analysis manager 220 corresponds to process action 106 of FIG. 1B.

The enhanced coverage analysis manager 220 accepts design data and static timing analysis data to generate coverage information with RTL. For an example of why RTL should be looked at, consider a path from A to B that is not covered by any of the static timing analysis. However, when the RTL is reviewed, it turns out that the path is a don't care path. So if the system only looks at gate level design, and coverage analysis is performed, then it may identify the path as being missed. Therefore, this present approach allows the system to automate the action of checking RTL information more effectively and realistically analyze coverage.

An output of the enhanced coverage analysis manager 220 is global coverage 224. Global coverage 224 refers to the coverage at the end of the analysis process, after analyzing the independent static timing elements and analyzing the RTL information.

Coverage constraints 222 refers to information that would allow a designer or the system to identify how to obtain complete coverage. For example, assume that the analysis process missed some logic that was not timed, such as an AND component that is always constrained off. A coverage constraint would be generating the constraint to enable the process to cover that constraint or that AND gate. Also, assume that the process includes one file and the designer had configured a test bit to be "on", but that file was accidentally copied run again. The designer might think that he has one hundred percent coverage, when in fact, the analysis only covered half of the design. The constraint that needs to be changed in this example is the test enable constraint, which should be toggled to get it to the other value to see the rest of the logic. So the coverage constraint 222 is if the analysis did not obtain 100% coverage, the constraint information will show how to get to this complete coverage.

Figure 3:
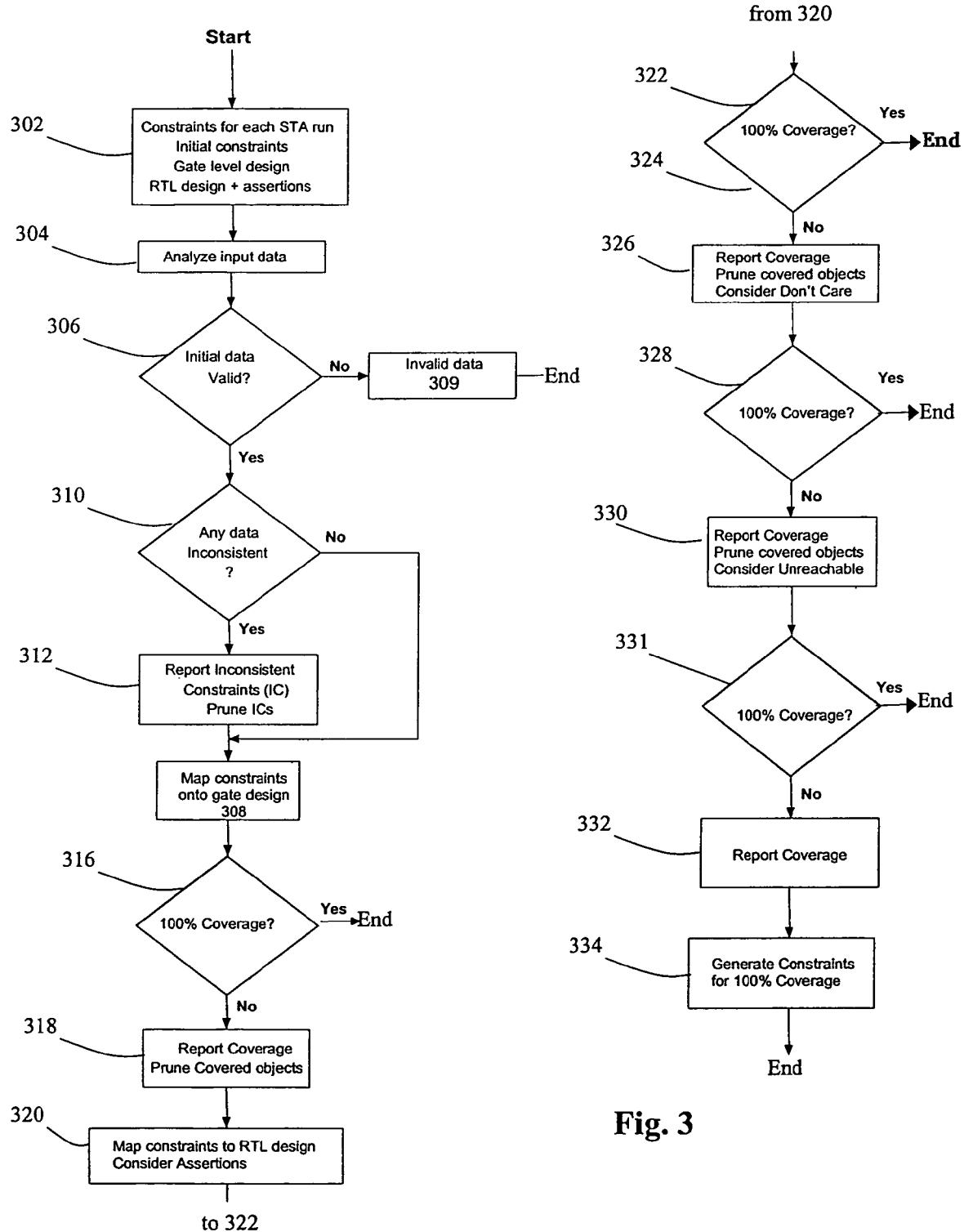
FIG. 3 illustrates a flow diagram for identifying coverage in gate level designs with corresponding architectural design data according to one embodiment of the invention.

Referring to FIG. 3, this flowchart describes detailed implementation details according to an embodiment of the invention. At 302, the circuit design is received for analysis, as well as other architectural information that may be useful, including, for example, a list of initial constraints and assertions. As noted above, the "constraints" are so called because they restrict the analysis of the design. If there were no constraints, then the entire design would undergo timing analysis. The gate level design and the RTL design including assertions would be taken in as inputs.

Then, the process analyses the input data (304). One type of analysis that is performed is to determine whether the data is valid (306). For example, the information is checked to determine whether there exists syntax errors or fundamental gate level design that does not correspond to the constraints. If the initial data is invalid, then error handling is performed (309) and the process ends.

At 310, the process makes an analysis to identify any data inconsistencies. An example of a data inconsistency is if the received information includes RTL data for first chip but gate level design data for second and entirely different chip. An example of an inconsistent constraint is if the design has a reset signal set to zero and also somewhere else in all those design files it also set to a one—causing an inconsistent constraints. If they exist, such inconsistencies and inconsistent constraints are reported and inconsistent constraints are pruned (312). By pruning such constraints, they will not be applied to the analysis.

At 308, the process map constraints onto the gate level or implementation level space. Then, the process checks the coverage (316). If coverage is 100% complete, then the process ends. An example is if there were no constraint files applied, and the static timing by default looked at every possible path. If, however, there was not 100% coverage, then the coverage is reported and the covered object are pruned (318). The coverage could be based upon any coverage abstraction. For example, if the coverage objects are gate-based, then coverage is reported based upon gates. As another example, if the coverage is in terms of start points and end points, then it will also be reports in such terms.

At 320, the process maps the constraints to RTL design and consider assertions. The process is now preparing to look at all the constraints with the RTL design. For example, equivalence checking techniques may be used to identify corresponding cones of logic between RTL and gate designs.

Determining that two designs (i.e., RTL and gate level) implement equivalent finite state machines (FSMs) is a fundamental step in the design and verification of digital circuit systems. This task can be performed by logic equivalence checkers, which verify the equivalence of two designs, which have identical state encoding. Equivalent or equivalence in the context of designs refers to equivalent FSMs. In the context of logic cones (described below), these terms refer to combinational equivalence.

Figure 4:
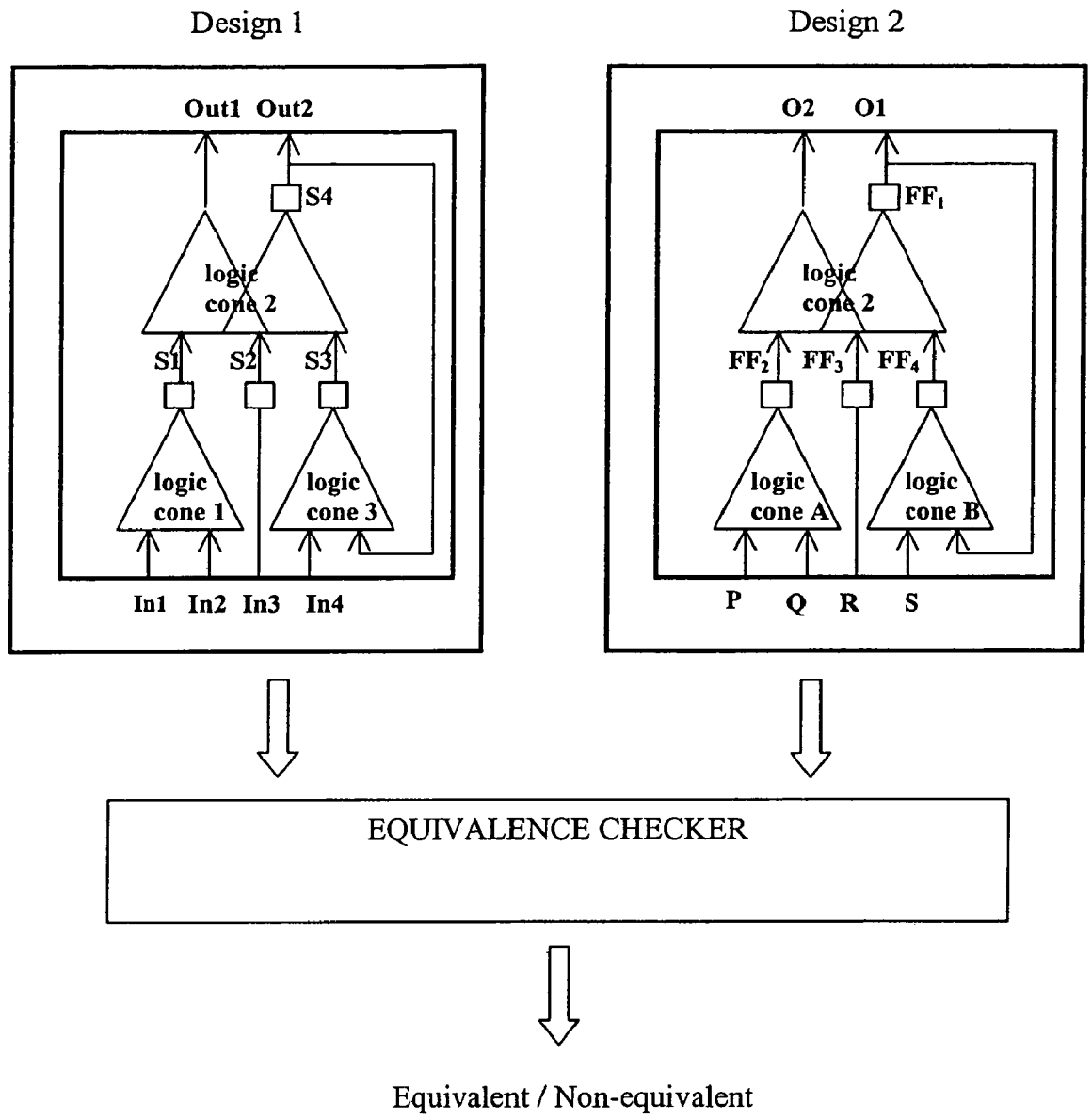
FIG. 4 illustrates the comparison of two designs which have identical state encoding.

FIG. 4 illustrates the comparison of two designs, Design 1 and Design 2, which have identical state encoding. Design 1 primary inputs {In1, In2, In3, In4} correspond to primary inputs {P, Q, R, S} in Design 2. The primary outputs {Out1, Out2} in Design 1 correspond to primary outputs {02, 01} in Design 2. The state elements, e.g. registers, of Design 1, {S4, S1, S2, S3} correspond to registers {FF1, FF2, FF3, FF4} in Design 2.

The state elements, and the primary inputs and outputs partition a design into logic cones. Logic cones are groups of combinational logic bordered by registers, and primary inputs and outputs. Design 1 contains three logic cones, shown as logic cone 1, logic cone 2, and logic cone 3, which are delineated by the primary inputs/outputs and the registers. Note that logic cone 2 is a multi-output logic cone.

Figure 5:
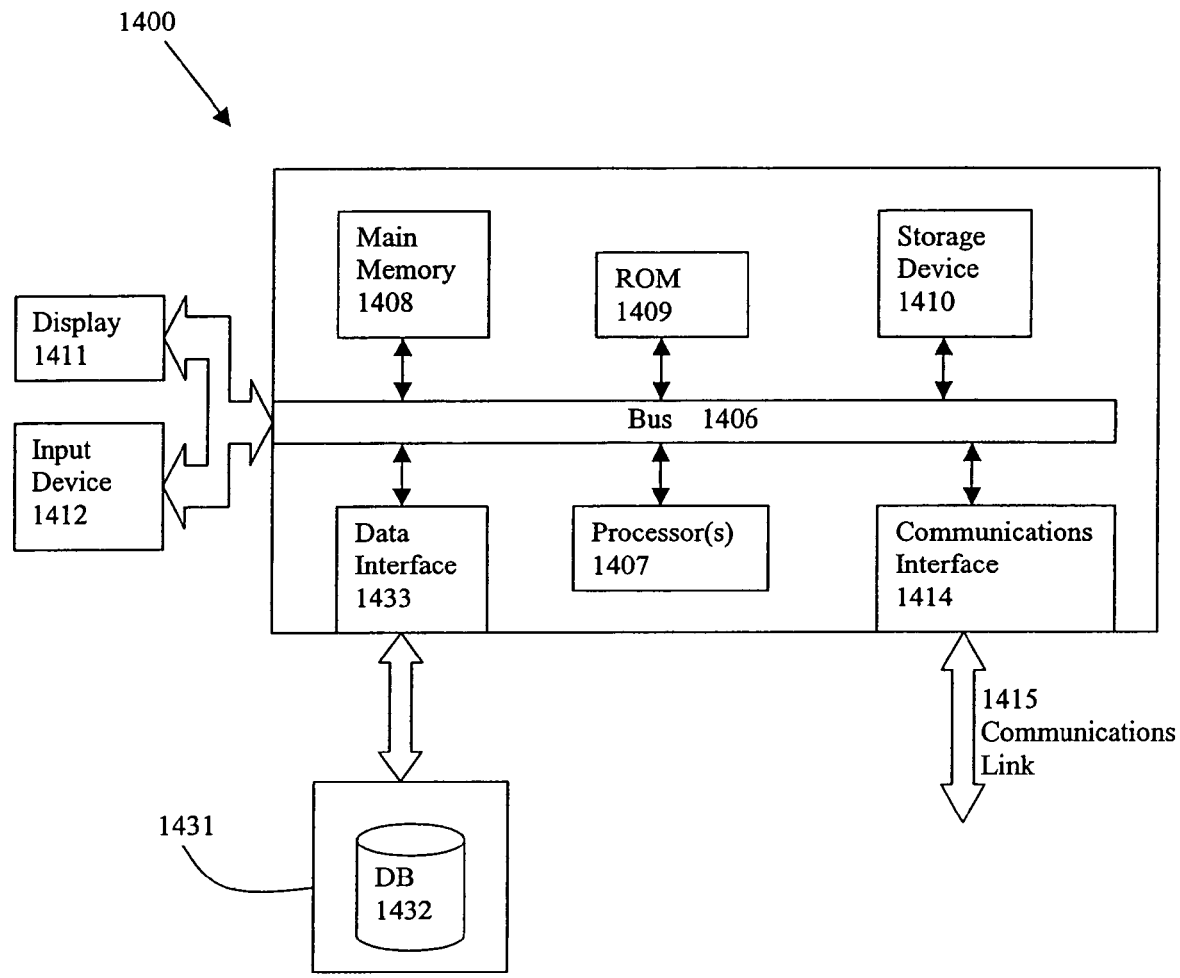
FIG. 5 illustrates an example computing architecture with which the invention may be implemented.

Showing that two designs with identical state encoding are equivalent can be done by showing the corresponding logic cones of the two designs to be combinationally equivalent. Identifying the corresponding logic cones can be done via a process known as mapping. Mapping logic cones in RTL designs to logic cones in gate level designs typically uses heuristics that consider design characteristics (i.e., fanin, fanout, hierarchy, signal names, logic signatures, etc.). Verifying the equivalence of Design 1 and Design 2 requires proving the 3 pairs of logic cones between Design 1 and Design 2, i.e. {logic cone 1, logic cone A}, {logic cone 2, logic cone C} and {logic cone 3, logic cone B}, are equivalent, as illustrated in FIG. 5.

Returning back to FIG. 3, at 322, the process will determine whether there is 100% coverage based upon the RTL information. If there is 100% coverage, then the process ends. Otherwise, the process reports the coverage and prunes the covered objects (326). At this point, the process will also consider don't care logic in the design.

The process then reviews again whether there is 100% coverage (328). If there is 100% coverage, then the process ends. Otherwise, the process reports the coverage and prunes the covered objects (330). At this point, the process will also consider unreachable objects in the design.

The process then reviews again whether there is 100% coverage (331). If there is 100% coverage, then the process ends. Otherwise, the process reports the coverage and prunes the covered objects (332). At this point, the process generates constraints for 100% coverage of the design (334). Many of the actions from 322 to 332 could be implemented as common steps, depending upon the specific implementation to which the invention is applied. The specific order shown in FIG. 3 is not necessarily, and could be based upon implementation choice.

System Architecture Overview

FIG. 5 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408. Transmission media includes coaxial cables, copper wire, and fiber optics, including wires that comprise bus 1406. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method for performing coverage analysis of a design, comprising:
   receiving a list of critical paths and one or more constraint information;
   identifying gate-level critical path coverage based at least in part upon gate-level information and the one or more constraint information;
   pruning the identified gate-level critical path coverage from the list of critical paths based at least in part upon identified coverage for the gate-level information;
   identifying RTL-level critical path coverage based at least in part upon RTL-level information;
   pruning the identified RTL-level critical path coverage from the list of critical paths based at least in part upon identified coverage for the RTL-level information;
   determining, by using a processor, a global coverage for the design based at least in part upon the pruned list of critical paths; and
   storing the global coverage for the design in a volatile or non-volatile computer readable medium or displaying the global coverage for the design on a display device.

2. The method of claim 1 in which static timing analysis is used to perform timing analysis of the design and determine constraint coverage.

3. The method of claim 1 further comprising:
   checking for data validity and reporting such invalid data if identified.

4. The method of claim 3 in which the act of checking for inconsistent data comprises:
   checking whether there exists syntax errors or fundamental gate level design that does not correspond to the constraint information.

5. The method of claim 1 further comprising:
   checking for an inconsistent constraint.

6. The method of claim 5 in which the design is checked for an inconsistent signal that has been set.

7. The method of claim 5 in which the inconsistent constraint is pruned.

8. The method of claim 1 in which the gate-level information comprises gate-level architectural information.

9. The method of claim 1 in which the RTL-level information comprises RTL-level architectural information and design representation.

10. The method of claim 1 further comprising the act of mapping the one or more constraint information onto the gate level or implementation level space.

11. The method of claim 10 in which coverage is checked based upon the act of mapping.

12. The method of claim 11 further comprising the act of pruning a covered object.

13. The method of claim 12 in which the covered object comprises a gate-based object or a path-based object.

14. The method of claim 12 in which coverage is reported.

15. The method of claim 1 further comprising the act of mapping the constraint information to the RTL-level information.

16. The method of claim 15 in which the act of mapping considers one or more assertions.

17. The method of claim 15 in which an equivalence checker is used to map onto the RTL-level information.

18. The method of claim 15 in which coverage is analyzed for Don't Care or unreachable objects.

19. The method of claim 15 in which coverage is reported.

20. The method of claim 1 in which gate-level analysis is performed prior to RTL-level analysis.

21. A computer program product comprising a volatile or non-volatile computer usable medium having executable code for executing a process using a processor for performing coverage analysis for a design, the process comprising:
   receiving a list of critical paths and one or more constraint information;
   identifying gate-level critical path coverage based at least in part upon gate-level information and the one or more constraint information;
   pruning the identified gate-level critical path coverage from the list of critical paths based at least in part upon identified coverage for the gate-level information;
   identifying RTL-level critical path coverage based at least in part upon RTL-level information;
   pruning the identified RTL-level critical path coverage from the list of critical paths based at least in part upon identified coverage for the RTL-level information;
   determining, by using one or more processors, a global coverage for the design based at least in part upon the pruned list of critical paths; and
   storing the global coverage for the design or displaying the global coverage for the design on a display device.

22. The product of claim 21 in which static timing analysis is used to perform timing analysis of the design and determine constraint coverage.

23. The product of claim 21 further comprising:
checking for data validity and reporting such invalid data if identified.

24. The product of claim 21 further comprising:
checking for an inconsistent constraint.

25. The product of claim 21 in which the gate-level information comprises gate-level architectural information.

26. The product of claim 21 in which the RTL-level information comprises RTL-level architectural information and design representation.

27. The product of claim 21 further comprising the act of mapping the one or more constraint information onto the gate level or implementation level space.

28. The product of claim 21 further comprising the act of mapping the constraint information to the RTL-level information.

29. The product of claim 21 in which gate-level analysis is performed prior to RTL-level analysis.

30. A system for performing coverage analysis for a design, the system comprising:
means for receiving a list of critical paths and one or more constraint information;
means for identifying gate-level critical path coverage based at least in part upon gate-level information and the one or more constraint information;
means for pruning the identified gate-level critical path coverage from the list of critical paths based at least in part upon identified coverage for the gate-level information;
means for identifying RTL-level critical path coverage based at least in part upon RTL-level information;
means for pruning the identified RTL-level critical path coverage from the list of critical paths based at least in part upon identified coverage for the RTL-level information;
a processor for determining a global coverage for the design based at least in part upon the pruned list of critical paths; and
a volatile or non-volatile computer readable medium for storing the global coverage for the design or a display device displaying the global coverage for the design.

31. The system of claim 30 further comprising means for using static timing analysis to perform timing analysis of the design and determine constraint coverage.

32. The system of claim 30 further comprising means for checking for data validity and reporting such invalid data if identified.

33. The system of claim 30 further comprising means for checking for an inconsistent constraint.

34. The system of claim 30 in which the gate-level information comprises gate-level architectural information.

35. The system of claim 30 in which the RTL-level information comprises RTL-level architectural information and design representation.

36. The system of claim 30 further comprising means for mapping the one or more constraint information onto the gate level or implementation level space.

37. The system of claim 30 further comprising means for mapping the constraint information to the RTL-level information.

38. The system of claim 30 further comprising means for performing gate-level analysis prior to RTL-level analysis.

* * * * *

UNITED STATES PATENT AND TRADEMARK OFFICE
CERTIFICATE OF CORRECTION

PATENT NO. : 7,587,690 B1 Page 1 of 1
APPLICATION NO. : 11/454075
DATED : September 8, 2009
INVENTOR(S) : Siarkowski et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 412 days.

Signed and Sealed this

Fourteenth Day of December, 2010

David J. Kappos
*Director of the United States Patent and Trademark Office*